United States Patent [19]
Stut et al.

[11] 3,941,900
[45] Mar. 2, 1976

[54] METHOD FOR PRODUCING HIGHLY PURE SILICON

[75] Inventors: Hans Stut, Grobenzell; Gerhard Barowski, Munich, both of Germany

[73] Assignee: Siemens Aktiengesellschaft, Berlin & Munich, Germany

[22] Filed: Feb. 20, 1974

[21] Appl. No.: 443,950

[30] Foreign Application Priority Data
Mar. 28, 1973 Germany............................ 2315469

[52] U.S. Cl. .......................... 427/86; 13/24; 118/4; 118/49.1; 118/49.5; 427/248
[51] Int. Cl.² ................................................ B05D 5/12
[58] Field of Search............ 117/201, 106 A, 106 R, 117/107.2; 219/271, 272, 275; 13/24; 427/86, 248; 118/4, 49.5, 49.1

[56] References Cited
UNITED STATES PATENTS

| | | | |
|---|---|---|---|
| 2,981,605 | 4/1961 | Rummel | 117/106 A |
| 3,053,638 | 9/1962 | Reiser | 117/106 A |
| 3,152,933 | 10/1964 | Reuschel | 117/106 A |
| 3,171,755 | 3/1965 | Reuschel et al. | 117/106 A |
| 3,200,009 | 8/1965 | Reuschel et al. | 117/106 A |
| 3,232,792 | 2/1966 | Rummel et al. | 117/106 A |
| 3,686,475 | 8/1972 | Mikkola | 219/272 |

*Primary Examiner*—Cameron K. Weiffenbach
*Attorney, Agent, or Firm*—Hill, Gross, Simpson, Van Santen, Steadman, Chiara & Simpson

[57] ABSTRACT

A method for producing highly pure silicon, or another semiconductor material, includes depositing the element from a corresponding reaction gas at the surface of several rod shaped carrier members composed of highly pure material, the carrier members being connected in series and permeated by a heating current supplied by an operational current source. In heating the serially connected carrier members, the members are first preheated by the application of a high voltage from a three phase supply, the carrier members being subdivided into groups with each group charged by a separate phase of the three phase voltage. Preheating is performed prior to connecting all of the carrier members to the operational supply.

6 Claims, 3 Drawing Figures

METHOD FOR PRODUCING HIGHLY PURE SILICON

BACKGROUND OF THE INVENTION

1. Field of the Invention

This invention concerns a method for the production of highly pure silicon or other semiconductor material, and is more particularly concerned with a method of producing highly pure semiconductor material by depositing the semiconductor material from a corresponding reaction gas at the outer surface of rod shaped carrier members which are heated to the depositing temperature in the reaction gas. The members consist of the same semiconductor material and are connected in series with respect to an operational current source which provides a direct current for heating the carrier members to the depositing temperature, and wherein prior to depositing the rod shaped carrier members are preheated by a multiphase voltage source with a high voltage.

2. Description of the Prior Art

A prior method of providing highly pure semiconductor material is disclosed in the French Pat. No. 1,125,207 and in the German published application No. 1,212,948. The preheating of the rodshaped carrier members, in particular consisting of highly pure silicon, by means of applying a sufficiently high auxiliary voltage has the advantage of all known methods of decreasing the resistance of the carrier member from a high value at room temperature to such a low value that the operational current source, operating at a considerably lower voltage, can further heat the carrier rods. Naturally, the goal of heating is achieved more quickly if the available auxiliary voltage is higher. Based on the auxiliary voltage, an electrical current of at first low strength flows in the carrier members which, however, develops sufficient heat in order to not only cover heat losses at the surroundings but also to gradually increase the temperature of the rods, and therefore is capable of decreasing rod resistance. Therefore, if a sufficiently high auxiliary voltage is elected, a static condition will not occur, but a successive increase in temperature and current will be experienced, and therefore a constant decrease of the electrical resistance of the carrier will be achieved, due to its decreasing temperature-resistance characteristic, until the operational current source, which provides a substantially lower voltage, is capable of supplying a current which can further heat the carrier rod notwithstanding this low voltage. If necessary, the preheating or "igniting" of the carrier rods can be supported by means of infra-red irradiation of the carrier rods.

On the one hand, preheating of the carrier rods requires a rather high voltage (several kV/m of the carrier rod). On the other hand, the load current during preheating is only in the order of magnitude of a millampere. A lower voltage is required for the operational source, however, several thousand ampere of heating current is experienced. This means, that for the operational source, a low voltage transformer and for the auxiliary voltage source a high voltage transformer are required.

It is possible, without particular difficulty, to heat several meters of carrier rods to the depositing temperature by means of an operational current source supplied by a current supply network in the case where silicon is used as a semiconductor. This fact is utilized in that, instead of a correspondingly long carrier rod, several carrier rods with shorter lengths are used, which rods are preferably arranged in the same reaction chamber and are connected in series with respect to the current source. However, a similar procedure with respect to the auxiliary voltage source which serves for preheating results in very high voltages. In order to avoid these, according to German Pat. No. 1,212,948, the carrier rods can be preheated individually by an auxiliary voltage source at correspondingly lower voltages in order to apply the rods individually to the operational current as soon as they are sufficiently preheated until such time as the operational current source is completely loaded. Such measures are, however, very time consuming.

SUMMARY OF THE INVENTION

With respect to the last-stated technique, it is more favorable to utilize a simultaneous preheating of all carrier rods, a technique which forms the basis of the present invention.

According to the invention, it is provided that an n-phase auxiliary voltage source ($n > 2$; $n =$ integer) supplies alternating current and the individual phases of the auxiliary voltage supplied by this source is applied to respective groups of the carrier members which, in turn, are already connected in a series circuit so that all carrier members have voltage applied thereto.

For the implementation of the method according to the invention, for example, an n-phase supply is required as the auxiliary voltage source, and its voltage is transformed via a n-phase transformer to a high voltage. The individual phases of the transformed voltage are then applied to each of the n groups of carrier members so that the preheating of the individual groups takes place simultaneously. Since, in addition, all carriers are already connected in series with an operational current source, only a simple and single switching process is required in order to apply the operational current to the carriers and to switch off the auxiliary source. This is possible in different ways, as will be described below.

It is to be understood that the method according to the invention saves time when compared to the method set forth in German Pat. No. 1,212,948. The decrease of the required auxiliary voltage is a further advantage. If for a simultaneous preheating of all carriers which are connected in series with an auxiliary direct voltage source or a nominal alternating voltage source, a voltage U is required in the case of the method of the present invention, a voltage is sufficient which has been decreased by the factor $\cos(\phi/n) < 1$. The most frequent case of application of the method according to the invention is in the application of a three-phase voltage as an auxiliary voltage source, since such a voltage is supplied by most of the common supply networks. Therefore, the following considerations will be limited, by way of discussion, to three phase situations. It can be readily recognized that in the case of a generalization to n-phases, the device characteristics, which can be appreciated from the drawings, and which are provided per phase, must be provided in correspondence to the large phase number $n$ times, rather than three times as in the example given.

BRIEF DESCRIPTION OF THE DRAWING

Other objects, features and advantages of the invention, its organization, construction and operation will be best understood from the following detailed description taken in conjunction with the accompanying drawings, on which.

DESCRIPTION OF THE PREFERRED EMBODIMENT

Figure 1:
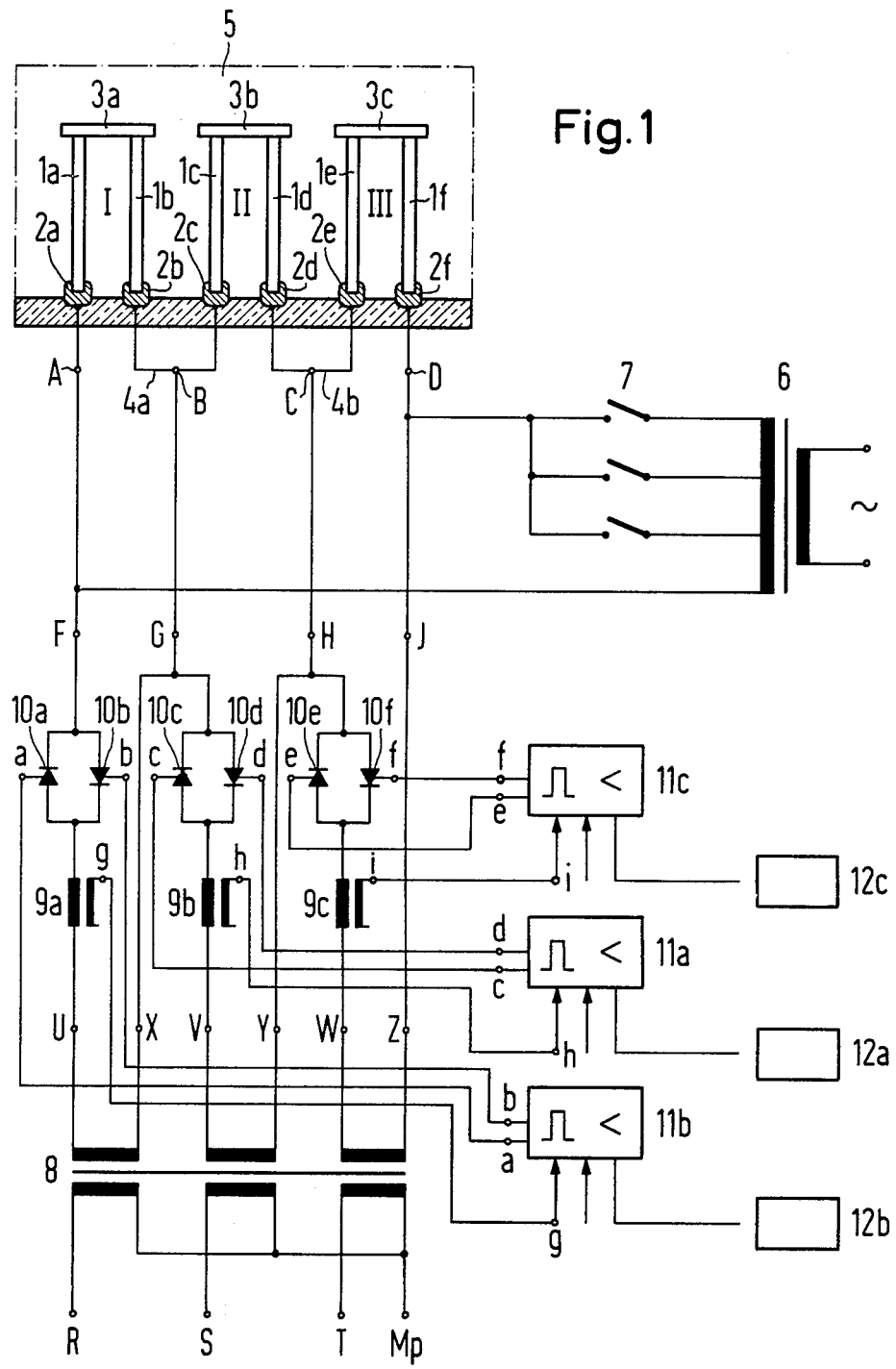
FIG. 1 is a schematic circuit diagram of a circuit constructed in accordance with the invention.

It is possible to maintain the working or operational voltage source switched off during preheating and to switch it on only if all rods have been preheated. This corresponds to the case illustrated in FIG. 1. In FIG. 1 a switch must be activated which supplies the working voltage to all carrier rods. However, the working voltage source can also be applied directly to the carrier rods with the primary side switched off) but the effectiveness can be eliminated at first by "short-circuiting" the working current source. After the preheating process has been carried out, that is after all groups of the carrier rods have reached the desired value of preheating current, this "short circuit" is eliminated so that the operational current source can operate on all carrier rods. The operational current source is provided, at least in this case, by the secondary side of a current transformer supplying a two phase alternating current by way of a low voltage transformer. As mentioned above, FIGS. 2 and 3 illustrate the application of the operational current source wherein it is "short-circuited" during preheating.

In the exemplary embodiment of the invention illustrated in FIG. 1, a plurality of silicon rods $1a-1f$ having approximately the same length are provided in a deposition chamber 5. The rods have, for example, a length of 0.4 to 2.0 m. The rods are divided into groups I, II and III. The rods $1a$ and $1b$ belong to group I the rods $1c$ and $1d$ to group II and the rods $1e$ and $1f$ to the group III. Each rod is mounted at its lower end in a vertical position by a respective electrode $2a-2f$ located at the bottom of the deposition chamber 5 and electrically insulated with respect to the other electrodes. The rod $1a$ is provided with the electrode $2a$, the rod $1b$ is provided with the electrode $2b$, and so on, with the rod $1f$ being provided with the electrode $2f$. At their upper ends, the rods are provided, in groups, with a conductive bridge, $3a$, $3b$ and $3c$, respectively, which bridge preferably consists of the respective highly pure semiconductor material, such as silicon. On the other, there is a conductive connection $4a$ and $4b$, respectively, between the electrodes $2b$ and $2c$ and the electrodes $2d$ and $2e$ comprising a respective center tap B and C. The electrode $2a$ is connected with a tap A, and the electrode $2f$ is connected with a tap D. A voltage source which is applied to the taps A and D is therefore applied by means of the series circuit of the groups I, II and III of the rod shaped carrier members to all of the carrier rods $1a-1f$ of the circuit while a voltage source which is applied between the terminals A, B, C and D, respectively, is only applied to one of the groups of the carrier rods, respectively.

Correspondingly, in the method according to the invention, the working current source is applied to the terminals A and D and one phase each of the auxiliary voltage source to the terminals A and B, or B and C, or C and D, respectively.

The arrangement of the carrier rods $1a-1f$, as mentioned above, is in a common reaction container or chamber 5, having a bottom which supports the electrodes $2a-2f$ mounting the carrier rods. The bottom of the container consists, for example, of a quartz plate or a metal plate. The reaction chamber 5 is indicated by a rectangular broken line in FIG. 1 and details, for example those concerning the supply of reaction gas, have been omitted in order to simplify the illustration.

The working current source is provided by the secondary winding of a transformer 6 which is connected to a normal two-phase alternating voltage source. The voltage may be taken from the available power network. It is advisable to provide means for keeping the amplitude or the effective value of the current flowing in the primary circuit of the transformer 6 at a constant level, which, however, will not be described in greater detail. The reader may, however, refer to other publications, such as German patent applications Nos. P 21 33 863.6 and P 21 53 566.0. It here suffices to say that one is dealing with the application of a voltage supply member, for example thyristors or the like where the trigger angle is adjusted in such a way that the current flowing in the primary circuit of the transformer 6 maintains the adjusted desired value.

Various taps are provided at the secondary side of the transformer 6 which make it possible to dimension the voltage to the terminals A and B and therefore to all of the rod shaped carrier members. It must be taken into consideration that the rod members $1a-1f$ increase in diameter during the deposition process and therefore change their resistance by one or several orders of magnitude. In that case, a correspondingly lower operating voltage is required in order to provide the carrier rod members with the currents which are required for maintaining the depositing temperature. Consequently, it is possible, by means of a switch 7 to connect various voltage values from the secondary side of the transformer 6 to all of the carrier rod members.

In the arrangement illustrated in FIG. 1, the switch 7 remains open and consequently, the carrier rods $1a-1f$ are separated from the working voltage source. Instead, the auxiliary voltage source is loaded by way of the terminal pairs F, G; G, H; and H, J, respectively with individual phases of a three-phase auxiliary voltage source applied at a plurality of terminals R, S, T and Mp. A three-phase high voltage transformer is connected to these terminals and has a secondary side of three windings which terminate in terminal pairs U, X; V, Y and W, Z, respectively, whereby the individual phases are directed to the groups I, II and III as illustrated in FIG. 1. Based on a diameter of a rod of 4–6 mm where silicon is concerned an auxiliary voltage of 500 V per meter of rod and a working voltage of approximately 150–200 V per meter are necessary.

The terminal pairs U, X; V, Y and W, Z of the secondary side of the three-phase transformer 8 operate on respective ones of the groups I, II, III. Therefore, the terminal pair U, X is connected with the terminal pair A, B; the terminal pair V, Y is connected with the terminal pair B, C; and the terminal pair W, Z is connected with the terminal pair C, D. Between these sets of terminals means for controlling, and thus limiting, the preheating current supplied by the three phase transformer 8 are provided for each of the groups I, II, III, where the current is limited to a value at which the working current source 6 shows a noticeably lower voltage than the auxiliary voltage source 8 and is in a position to carry out the further heating of the carrier rods 1a–1f without further support from the auxiliary voltage source, and finally, to maintain the necessary depositing temperature.

In each of the circuits operated by the individual phases of the secondary voltage of the auxiliary voltage source 8, an element is provided which supervises the current, for example, respective current transformers 9a, 9b, 9c. Each of these supervising elements are connected in series with a respective pair of thyristors 10a, 10b; 10c, 10d; and 10e, 10f, each pair of thyristors being connected in an anti-parallel arrangement. By means of these thyristor pairs, the effective point for the positive or negative amplitude of the respective phase of the auxiliary voltage source 8 can be adjusted. The adjustment itself is transmitted by way of a respective control circuit 11a, 11b and 11c.

For this purpose, the current transformers 9a, 9b and 9c, respectively, operate on the respectively assigned control circuit 11a, 11b and 11c which form, together with the aforementioned thyristor pairs, respective alternating current sources for the auxiliary circuits. The control circuits 11a, 11b and 11c, respectively, each contain a two-pulse control set, which means a pulse generator which releases a positive and a negative pulse per period of the respective phase of the auxiliary voltage source 8 to the associated thyristor pairs and therefore determine the arithmetic medium value or the effective value of the preheating current of the respective group I, II and III.

As soon as the preheating current in the individual phases of the auxiliary voltage source has reached the final value which is prescribed for the respective phase, the control circuits 11a, 11b and 11c, respectively, provide that the preheating current is maintained (in particular that it cannot run away). The final condition thus achieved for each phase is registered by one of the integral value stages 12a, 12b and 12c which are assigned to the respective phases.

The switching off of the auxiliary voltage source 8 and the activation of the working current source 6, which is directly connected therewith, advantageously takes place at the instant at which all carrier rods 1a–1f conduct the desired value of heating current. This means that a preheating current which keeps the temperature of the carrier rods so high that during the subsequent acceptance of the rods by the working current source 6, that source is in a position to further heat the carrier rod 7 to the final depositing temperature, for example to a temperature of 1100°–1200°C. Experience has shown that this final value of the preheating current constitutes approximately 0.5–0.9 times the operating current which is necessary at the beginning of deposition when silicon carrier rods are used.

Figure 2:
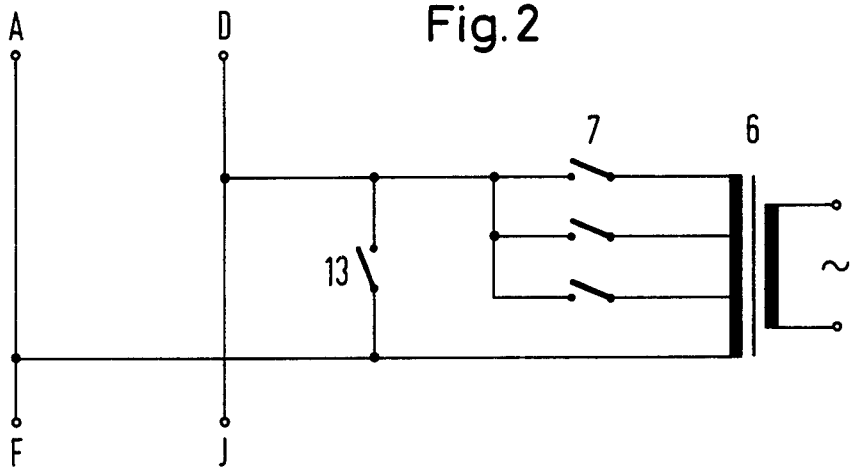
FIGS. 2 and 3 illustrate modifications of the circuit of FIG. 1 wherein auxiliary switches are provided for short circuiting the operational source.
Figure 3:
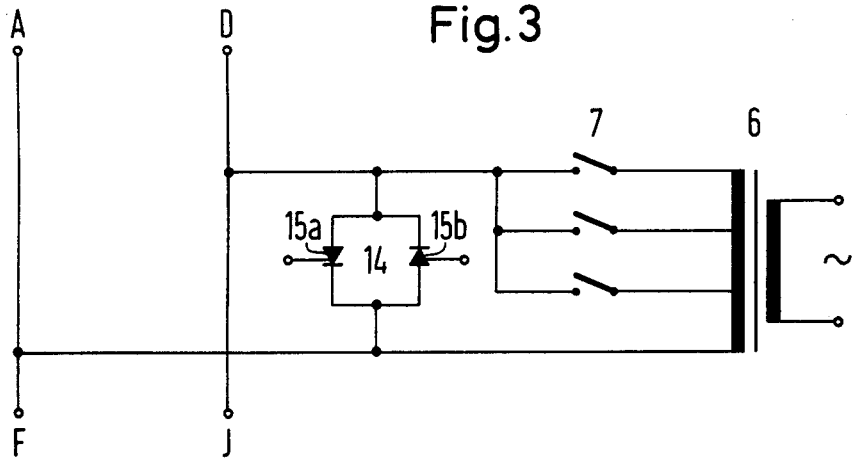

Consequently, the switch 7 must be constructed to handle these current and voltage values and is therefore relatively expensive. A less voltage resistant and therefore also less expensive switch will be satisfactory, if the working voltage source 6 is short-circuited with an auxiliary switch as illustrated in FIGS. 2 and 3. In FIG. 2 the auxiliary switch is provided by a switch 13 connected across the secondary of the transformer 6; whereas in FIG. 3 a pair of antiparallel connected thyristors are used. In either case, the auxiliary switch only has to conduct a comparitively low current supplied by the auxiliary voltage source 8. The switch 13 is opened shortly before the auxiliary current source 8 is switched off and therefore the operating current supplied by the working current source 6 is applied to all of the serially connected carrier rods 1a–1f.

In the circuit illustrated in FIG. 3, the degree of the short circuit of the working current source, and therefore the degree of the operation of the working current into the carrier rods can be adjusted so that, by means of the device illustrated in FIG. 3 and connected into the circuit of FIG. 1, it is possible that the operating current can be controlled in synchronism with a decrease of the preheating current. When using the embodiment illustrated in FIG. 3, a continuous acceptance of the carrier rods to the working current source is possible.

Although we have described our invention by reference to particular illustrative embodiment thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for the production of highly pure silicon by depositing silicon from a corresponding reaction gas on the outer surface of silicon rod-shaped carrier members which are heated in the reaction gas to the depositing temperature, comprising the steps of simultaneously preheating the members to a predetermined temperature by connecting separate groups of carrier members to separate phases of an $n$-phase electrical supply, where $n$ is an integer larger than two; and heating the carrier members to the depositing temperature by connecting the carrier members, contemporaneously with their group phase connections, in series and connecting the series to a heating current source.

2. The method according to claim 1 wherein the step of heating includes the step of connecting a two-phase alternating supply via a transformer as the heating current source, and wherein the step of preheating is further defined by the step of connecting a three-phase transformer between a three-phase supply and the respective groups of carrier members.

3. The method according to claim 2, comprising the step of adjusting a constant primary current for the heating current supply.

4. The method according to claim 3, comprising the step of controlling the currents supplied to the respective groups of carrier members.

5. The method according to claim 4 comprising the steps of maintaining the individual preheating currents at a constant desired value until all such currents achieve the desired value and, immediately prior to applying the heating current, turning off the three-phase supply.

6. The method according to claim 5, comprising the step of establishing a short circuit across the output of the transformer which supplies the heating current and removing the short circuit after the three-phase supply is switched off.

* * * * *